United States Patent
Li et al.

(10) Patent No.: US 12,494,420 B2
(45) Date of Patent: Dec. 9, 2025

(54) INTERPOSER WITH SIGNAL TRANSMISSION VIAS AND CHIP PACKAGE STRUCTURE

(71) Applicant: Sanechips Technology Co., Ltd., Shenzhen (CN)

(72) Inventors: Leqi Li, Shenzhen (CN); Yelei Xie, Shenzhen (CN); Jian Pang, Shenzhen (CN); Tuobei Sun, Shenzhen (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 484 days.

(21) Appl. No.: 18/011,500

(22) PCT Filed: May 27, 2021

(86) PCT No.: PCT/CN2021/096384
§ 371 (c)(1),
(2) Date: Dec. 19, 2022

(87) PCT Pub. No.: WO2021/258981
PCT Pub. Date: Dec. 30, 2021

(65) Prior Publication Data
US 2023/0290713 A1    Sep. 14, 2023

(30) Foreign Application Priority Data
Jun. 22, 2020   (CN) .......................... 202010576336.8

(51) Int. Cl.
*H01L 23/498*   (2006.01)
*H01L 23/58*    (2006.01)

(52) U.S. Cl.
CPC .. *H01L 23/49827* (2013.01); *H01L 23/49838* (2013.01); *H01L 23/58* (2013.01)

(58) Field of Classification Search
CPC ......... H01L 23/49827; H01L 23/49838; H01L 23/58
See application file for complete search history.

(56) References Cited

U.S. PATENT DOCUMENTS

| | | | |
|---|---|---|---|
| 8,492,903 B2 | 7/2013 | Bartley et al. | |
| 2010/0237386 A1* | 9/2010 | Lin | H10D 89/601 |
| | | | 257/E23.141 |

(Continued)

FOREIGN PATENT DOCUMENTS

| | | |
|---|---|---|
| CN | 103165479 A | 6/2013 |
| CN | 105633040 A | 6/2016 |

(Continued)

OTHER PUBLICATIONS

International Search Report and Written Opinion for International Application No. PCT/CN2021/096384 mailed Aug. 24, 2021.

(Continued)

*Primary Examiner* — Eliseo Ramos Feliciano
*Assistant Examiner* — Timothy Edward Duren
(74) *Attorney, Agent, or Firm* — Vivacqua Crane, PLLC

(57) ABSTRACT

Disclosed are an interposer and a chip package structure. The interposer may include: at least one signal transmission vias; at least one insulator isolation rings, one of said insulator isolation rings encircling one of said signal transmission vias; and at least one reverse-biased PN junction isolation rings, one of said reverse-biased PN junction isolation rings surrounding at least one of said insulator isolation rings, and the reverse-biased PN junction isolation ring including a semiconductor ring of a first conductivity type and a semiconductor ring of a second conductivity type from inside to outside, the semiconductor ring of the second conductivity type is connected to a bias potential.

10 Claims, 4 Drawing Sheets

(56) References Cited

U.S. PATENT DOCUMENTS

| | | | |
|---|---|---|---|
| 2012/0326319 A1 | 12/2012 | Yu | |
| 2013/0001676 A1* | 1/2013 | Bartley | H01L 21/76898 |
| | | | 257/330 |
| 2014/0054742 A1* | 2/2014 | Katti | H01L 23/5223 |
| | | | 257/503 |
| 2021/0098572 A1* | 4/2021 | Watanabe | H10D 8/25 |
| 2021/0313421 A1* | 10/2021 | Zhu | H10D 30/60 |

FOREIGN PATENT DOCUMENTS

| | | |
|---|---|---|
| JP | 2016-035948 A | 3/2016 |
| WO | WO 2014/013078 A1 | 1/2014 |

OTHER PUBLICATIONS

First Office Action and Search Report for Japanese Application No. 2022-578788, mailed Jan. 31, 2024.

* cited by examiner

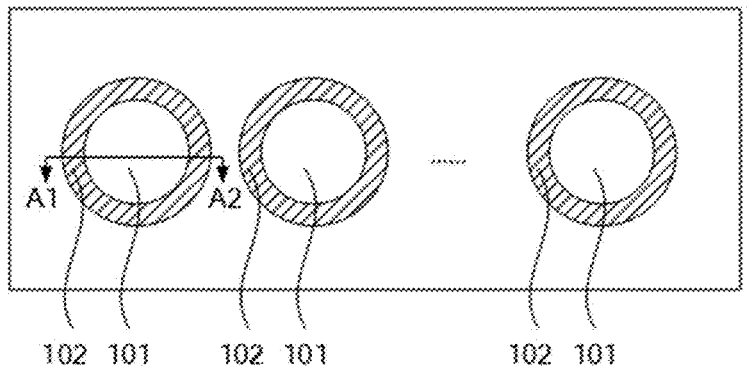
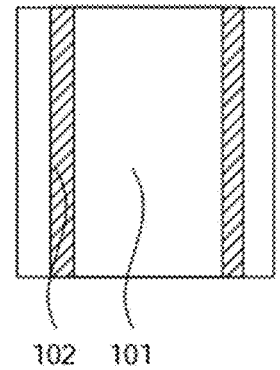
Fig. 1a  Fig. 1b
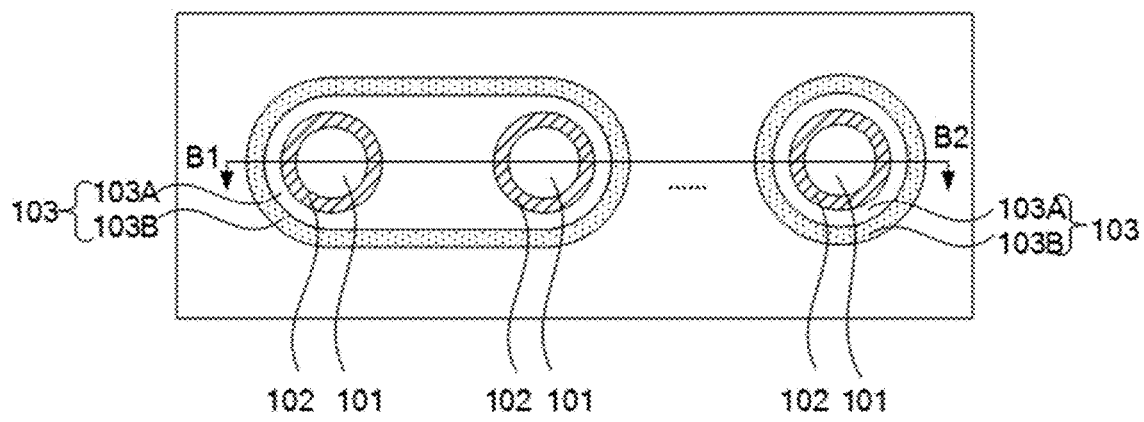
Fig. 2a
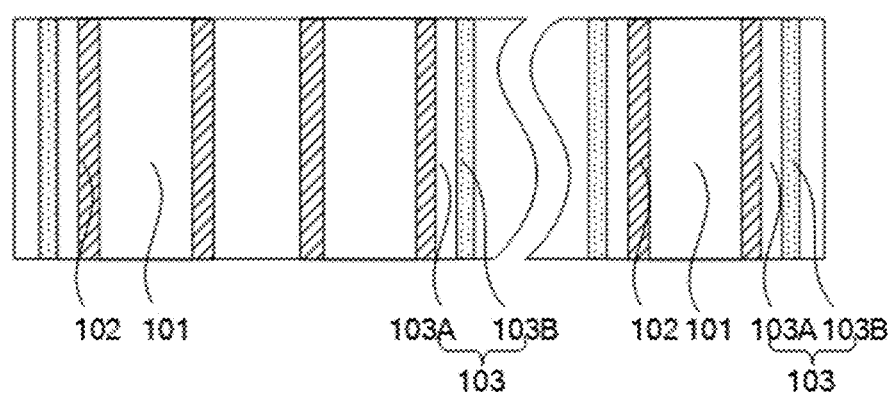
Fig. 2b

INTERPOSER WITH SIGNAL TRANSMISSION VIAS AND CHIP PACKAGE STRUCTURE

CROSS-REFERENCE TO RELATED APPLICATION

This application is a national stage filing under 35 U.S.C. § 371 of international application number PCT/CN2021/096384, filed May 27, 2021, which claims priority to Chinese patent application No. 202010576336.8, filed Jun. 22, 2020. The contents of these applications are incorporated herein by reference in their entirety.

TECHNICAL FIELD

The present disclosure relates to the technical field of semiconductor packaging, and more particularly, to an interposer and a chip package structure.

BACKGROUND

With the increasing integration level and storage capacity of semiconductor integrated circuits, conventional chip packaging has been replaced by three-dimensional (3D) packaging that stacks individual chips. In the 3D packaging of stacked individual chips, through silicon vias in an interposer are filled with conductive material to serve as signal transmission vias, thereby realizing signal transmission between chips and between a chip and a substrate.

However, as the integration level and hence complexity of chips increase, the density of signal transmission vias in the existing interposers is ever increasing, which leads to the increase in coupling and crosstalk between signal channels in different signal transmission vias.

SUMMARY

An embodiment of the present disclosure provides an interposer, which may include: at least one signal transmission vias; at least one insulator isolation rings, one of said insulator isolation rings encircling one of said signal transmission vias; at least one reverse-biased PN junction isolation rings, one of said reverse-biased PN junction isolation rings surrounding at least one of said insulator isolation rings, and the reverse-biased PN junction isolation ring including a semiconductor ring of a first conductivity type and a semiconductor ring of a second conductivity type from inside to outside, wherein the semiconductor ring of the second conductivity type is connected to a bias potential.

In order to achieve the above objective, a further embodiment of the present disclosure provides a chip package structure, which may include: a substrate, wherein the substrate is provided with at least one pad; an interposer located on a surface of the substrate, wherein the interposer is the interposer as described in any one of the above technical schemes, and one signal transmission via is coupled to one of said pads; and a chip, wherein the chip is located on one side of the interposer away from the substrate, and the chip is provided with a connection pad, the connection pad being coupled to the signal transmission via.

BRIEF DESCRIPTION OF DRAWINGS

FIG. 1 is a schematic diagram of a structure of an interposer in some cases;

FIG. 2a is a schematic diagram of a structure of an interposer provided by an embodiment of the present disclosure;

FIG. 2b is a sectional view taken along the line "B1-B2" of FIG. 2a;

FIG. 3b is a sectional view taken along the line "B1-B2" of FIG. 3a;

FIG. 4b is a sectional view taken along the line "C1-C2" of FIG. 4a;

FIG. 4c is another sectional view taken along the line "C1-C2" of FIG. 4a; and

DETAILED DESCRIPTION

Figure 3A:
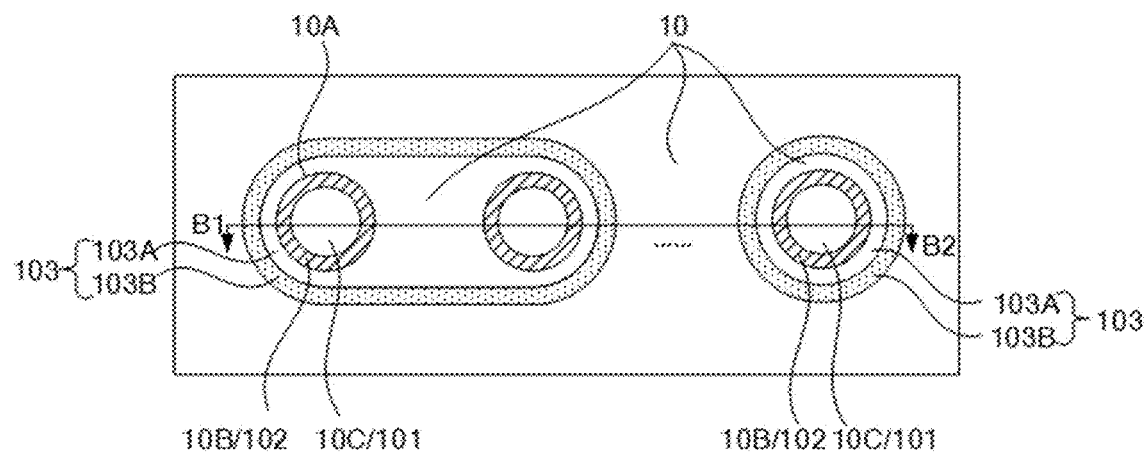
FIG. 3a is a schematic diagram of a structure of another interposer provided by an embodiment of the present disclosure.

It should be understood that the embodiments described here are intended only to explain the present disclosure and are not intended to limit the present disclosure.

In the following description, suffixes such as "module", "component" and "unit" used to represent elements are only to facilitate the description of the present disclosure, and have no special meanings in themselves. Therefore, "module", "component" or "unit" can be used in a mixed way.

As described above in the background, the density of signal transmission vias in the existing interposer is ever increasing, which leads to the increase in coupling and crosstalk between signal channels in different signal transmission vias. FIG. 1 is a schematic diagram of a structure of an interposer in some cases. In an embodiment, FIG. 1b is a sectional view taken along the line "A1-A2" of FIG. 1a. Referring to FIG. 1, the interposer includes at least one signal transmission vias 101 and insulator isolation ring(s) 102 encircling the signal transmission via(s) 101. As the density of the signal transmission vias 101 increases, the coupling and crosstalk between signal channels in different signal transmission vias 101 also increase.

In view of the above technical problem, an embodiment of the present disclosure provides an interposer intended to reduce coupling and crosstalk between signal channels in different signal transmission vias in an interposer.

FIG. 2 is a schematic diagram of a structure of an interposer provided by an embodiment of the present disclosure. In an embodiment, FIG. 2b is a sectional view taken along the line "B1-B2" of FIG. 2a. Referring to FIG. 2, the interposer includes: at least one signal transmission vias 101; at least one insulator isolation rings 102, one insulator isolation ring 102 encircling one signal transmission via 101; at least one reverse-biased PN junction isolation rings 103, one reverse-biased PN junction isolation ring 103 surrounding at least one insulator isolation ring 102, and the reverse-biased PN junction isolation ring 103 including a semiconductor ring 103A of a first conductivity type and a semiconductor ring 103B of a second conductivity type from inside to outside, wherein the semiconductor ring 103B of the second conductivity type is connected to a bias potential.

In some cases, signal channels in different signal transmission vias 101 may be subjected to coupling and crosstalk through the insulator isolation rings 102.

In an embodiment, FIG. 2 separately illustrates a case where one reverse-biased PN junction isolation ring 103 surrounds one insulator isolation ring 102 and a case where one reverse-biased PN junction isolation ring 103 surrounds two insulator isolation rings 102.

In this embodiment, under the coupling effect of the semiconductor ring 103A of the first conductivity type and the signal channel in the signal transmission via 101, the potential of the semiconductor ring 103A of the first conductivity type is the signal coupling potential, and the semiconductor ring 103B of the second conductivity type is connected to a bias potential. There is a space charge region at the interface between the semiconductor ring 103A of the first conductivity type and the semiconductor ring 103B of the second conductivity type, and since the semiconductor ring 103A of the first conductivity type and the semiconductor ring 103B of the second conductivity type form a reverse-biased PN junction isolation ring 103, a depletion layer exists in the space charge region, and the depletion layer in the space charge region can function to isolate and shield the signal transmission via 101, so as to reduce coupling and crosstalk between signal channels in different signal transmission vias 101 in the interposer. In addition, the stronger the strength of the signal in the signal channel in the signal transmission via 101, the greater the magnitude of the signal coupling potential of the semiconductor ring 103A of the first conductivity type. The thicker the depletion layer in the space charge region, the stronger the isolation and shielding effect of the reverse-biased PN junction isolation ring 103 on the signal transmission via 101.

In an embodiment, referring to FIG. 2, the signal channels of the signal transmission vias 101 that are distributed in a space surrounded by the reverse-biased PN junction isolation ring 103 are coupled to each other.

Specifically, FIG. 2 illustrates a case where one reverse-biased PN junction isolation ring 103 surrounds two insulator isolation rings 102, that is, when there are two signal transmission vias 101 distributed in the space surrounded by the reverse-biased PN junction isolation ring 103, the signal channels of these two signal transmission vias 101 are coupled to each other. The signal in the signal channel of one of the signal transmission vias 101 is coupled with the signal in the signal channel of the other one of the signal transmission vias 101. The depletion layer in the reverse-biased PN junction isolation ring 103 can function to isolate and shield the signal transmission vias 101 inside from those outside the space surrounded by the reverse-biased PN junction isolation ring 103, so as to reduce coupling and crosstalk between signal channels in different signal transmission vias 101 inside and outside the space surrounded by the reverse-biased PN junction isolation ring 103 in the interposer. In addition, the stronger the strength of the signal in the signal channel in the signal transmission via 101, the greater the magnitude of the signal coupling potential of the semiconductor ring 103A of the first conductivity type. The thicker the depletion layer in the space charge region, the stronger the isolation and shielding effect of the reverse-biased PN junction isolation ring 103 on the signal transmission via 101. In addition, the fact that the signal transmission vias 101 in which the signal channels are coupled to each other are distributed in the space surrounded by one reverse-biased PN junction isolation ring 103 reduces the area occupied by the reverse-biased PN junction isolation ring 103 in the interposer, improves the integration of the interposer, and reduces the manufacturing costs of the interposer. It should be noted that, by providing a conductive interconnection line, electrical connection can be realized between different signal transmission vias 101 and the same conductive interconnection line, so as to realize mutual coupling of signal channels of different signal transmission vias 101. Embodiments of the present disclosure do not limit the number of signal transmission vias 101 distributed in the space surrounded by the reverse-biased PN junction isolation ring 103.

In the above technical schemes, the depletion layer in the reverse-biased PN junction isolation ring 103 can function to isolate and shield the signal transmission via 101, so as to reduce the coupling and crosstalk between signal channels in different signal transmission vias 101 in the interposer.

In an embodiment, referring to FIG. 2, the signal transmission vias 101 are uniformly distributed in a space surrounded by the reverse-biased PN junction isolation ring 103.

In an embodiment, the signal transmission vias 101 are uniformly distributed in the space surrounded by the reverse-biased PN junction isolation ring 103, so that the signal transmission vias 101 are uniformly distributed in the space surrounded by the depletion layer in the reverse-biased PN junction isolation 103, so as to achieve the effect of uniformly reducing the coupling and crosstalk between signal channels in different signal transmission vias 101 in the interposer.

In an embodiment, referring to FIG. 2, one reverse-biased PN junction isolation ring 103 surrounds one insulator isolation ring 102, and the signal transmission via 101 and the reverse-biased PN junction isolation ring 103 are coaxially provided.

In an embodiment, one reverse-biased PN junction isolation ring 103 surrounds one insulator isolation ring 102, and the signal transmission via 101 and the reverse-biased PN junction isolation ring 103 are coaxially provided to ensure that the signal transmission vias 101 are uniformly distributed in the space surrounded by the depletion layer in the reverse-biased PN junction isolation 103, so as to achieve the effect of uniformly reducing the coupling and crosstalk between signal channels in different signal transmission vias 101 in the interposer.

In an embodiment, the first conductivity type includes an N type and the second conductivity type includes a P type, and the semiconductor ring 103B of the second conductivity type is grounded.

Specifically, the semiconductor ring 103A of the first conductivity type is an N-type semiconductor ring and the semiconductor ring 103B of the second conductivity type is a P-type semiconductor ring, and the potential of the semiconductor ring 103A of the first conductivity type is the signal coupling potential, and the semiconductor ring of the second conductivity type is grounded, so as to ensure that the semiconductor ring 103A of the first conductivity type and the semiconductor ring 103B of the second conductivity type are in a reverse-biased state. There is a space charge region at the interface between the semiconductor ring 103A of the first conductivity type and the semiconductor ring 103B of the second conductivity type, and a depletion layer exists in the space charge region, and the depletion layer in the space charge region can function to isolate and shield the signal transmission via 101, so as to reduce coupling and crosstalk between signal channels in different signal transmission vias 101 in the interposer. In addition, the stronger the strength of the electrical signal in the signal channel in the signal transmission via 101, the greater the magnitude of the signal coupling potential. The thicker the depletion layer in the space charge region, the stronger the isolation and shielding effect of the reverse-biased PN junction isolation ring 103 on the signal transmission via 101.

In an embodiment, the first conductivity type includes a P type and the second conductivity type includes an N type, and the semiconductor ring 103B of the second conductivity type is connected to a first potential that is greater than the signal coupling potential of the semiconductor ring 103A of the first conductivity type.

The semiconductor ring 103A of the first conductivity type is a P-type semiconductor ring and the semiconductor ring 103B of the second conductivity type is an N-type semiconductor ring, and the potential of the semiconductor ring 103A of the first conductivity type is the signal coupling potential, and the semiconductor ring 103B of the second conductivity type is connected to the first potential, so as to ensure that the semiconductor ring 103A of the first conductivity type and the semiconductor ring 103B of the second conductivity type are in a reverse-biased state. The semiconductor ring 103A of the first conductivity type and the semiconductor ring 103B of the second conductivity type constitute a reverse-biased PN junction isolation ring 103, and a depletion layer exists in the space charge region, and the depletion layer in the space charge region can function to isolate and shield the signal transmission via 101, so as to reduce coupling and crosstalk between signal channels in different signal transmission vias 101 in the interposer. In addition, the stronger the strength of the electrical signal in the signal channel in the signal transmission via 101, the greater the magnitude of the first potential. The thicker the depletion layer in the space charge region, the stronger the isolation and shielding effect of the reverse-biased PN junction isolation ring 103 on the signal transmission via 101.

Figure 3B:
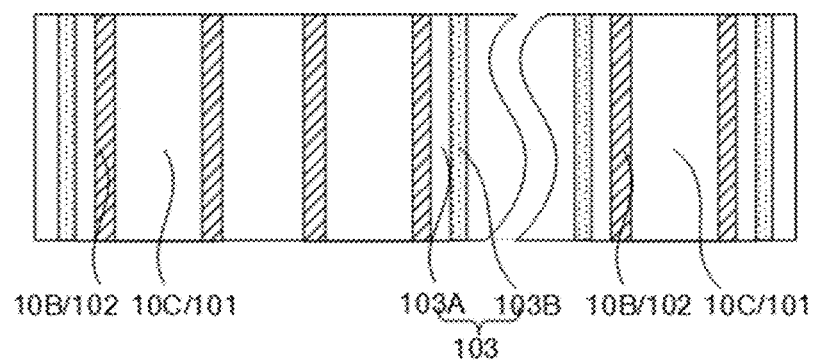

In the above technical schemes, the interposer includes insulator isolation rings 102 and reverse-biased PN junction isolation rings 103 to reduce coupling and crosstalk between signal channels in different signal transmission vias 101 in the interposer, and the specific structure of the interposer will be described in detail below. FIG. 3 is a schematic diagram of a structure of another interposer provided by an embodiment of the present disclosure. In an embodiment, FIG. 3b is a sectional view taken along the line "B1-B2" of FIG. 3a. In an embodiment, referring to FIG. 3, this interposer further includes a semiconductor substrate 10 of the first conductivity type, wherein the semiconductor substrate 10 of the first conductivity type is provided with at least one through hole 10A and at least one semiconductor ring 103B of the second conductivity type; an insulator material 10B and a conductive post 10C are provided in the through hole 10A in sequence from outside to inside, the insulator material 10B constituting the insulator isolation ring 102 and the conductive post 10C constituting the signal transmission via 101; and one semiconductor ring 103B of the second conductivity type surrounds at least one through hole 10A and is spaced from the through hole 10A by a preset distance, and the semiconductor substrate 10 of the first conductivity type between the through hole 10A and the semiconductor ring 103B of the second conductivity type constitutes the semiconductor ring 103A of the first conductivity type.

In an embodiment, a silicon substrate of the first conductivity type may be selected as the semiconductor substrate 10 of the first conductivity type. The entire interposer is fabricated on the silicon substrate of the first conductivity type. The through hole 10A is formed by means of an etching process. The insulator material 10B and the conductive post 10C are provided on the inner wall of the through hole 10A in sequence, the insulator material 10B constituting the insulator isolation ring 102 and the conductive post 10C constituting the signal transmission via 101. Thereafter, the surfaces of the silicon substrate 10 of the first conductivity type, the insulator material 10B, and the conductive post 10C may be mechanochemically polished until the surfaces of the silicon substrate 10 of the first conductivity type and the through hole 10A are smooth and flat. Here, the insulator isolation ring 102 constituted by the insulator material 10B functions to isolate and shield the signal transmission via 101 constituted by the conductive post 10C. In addition, under the coupling effect of the semiconductor ring 103A of the first conductivity type and the signal channel in the signal transmission via 101, the potential of the semiconductor ring 103A of the first conductivity type is the signal coupling potential, and the semiconductor ring 103B of the second conductivity type is connected to a bias potential. There is a space charge region at the interface between the semiconductor ring 103A of the first conductivity type and the semiconductor ring 103B of the second conductivity type, and since the semiconductor ring 103A of the first conductivity type and the semiconductor ring 103B of the second conductivity type form a reverse-biased PN junction isolation ring 103, a depletion layer exists in the space charge region, and the depletion layer in the space charge region can function to isolate and shield the signal transmission via 101, so as to reduce coupling and crosstalk between signal channels in different signal transmission vias 101 in the interposer. In addition, the stronger the strength of the signal in the signal channel in the signal transmission via 101, the greater the magnitude of the signal coupling potential of the semiconductor ring 103A of the first conductivity type. The thicker the depletion layer in the space charge region, the stronger the isolation and shielding effect of the reverse-biased PN junction isolation ring 103 on the signal transmission via 101.

In an embodiment, the material of the semiconductor ring 103B of the second conductivity type includes at least one of a metal oxide of the second conductivity type, an element semiconductor material of the second conductivity type, or a compound semiconductor material of the second conductivity type.

In an embodiment, an explanation will be given with an example where the first conductivity type is the N type and the second conductivity type is the P type. Aluminum-doped zinc oxide and tin-doped silver oxide, etc., may be used as P-type metal oxides. A silicon material doped with P-type impurities may be used as a P-type element semiconductor material. A gallium nitride material doped with P-type impurities may be used as a P-type compound semiconductor material.

It should be noted that the fabrication process for the semiconductor ring 103B of the second conductivity type may be the semiconductor ring 103B of the second conductivity type being obtained through ion doping based on the semiconductor substrate 10 of the first conductivity type. The semiconductor ring 103B of the second conductivity type may also be formed by etching a through hole in the semiconductor substrate 10 of the first conductivity type and filling the through hole with at least one of the metal oxide of the second conductivity type, the element semiconductor material of the second conductivity type, or the compound semiconductor material of the second conductivity type.

In an embodiment, the material of the conductive post 10C may be copper and/or aluminum which has good conductivity and low price.

In a 3D package of stacked individual chips, the signal transmission vias 101 in an interposer are provided to realize signal transmission between chips and between a chip and a substrate. Here, electrostatic charges will be delivered to the chip through the signal transmission vias 101, and since different chips have different anti-static electricity abilities, the chip performance of chips with weak anti-static electricity ability will be greatly affected due to the influence of electrostatic charge. To solve the above technical problem, embodiments of the present disclosure provide the following technical schemes.

Figure 4A:
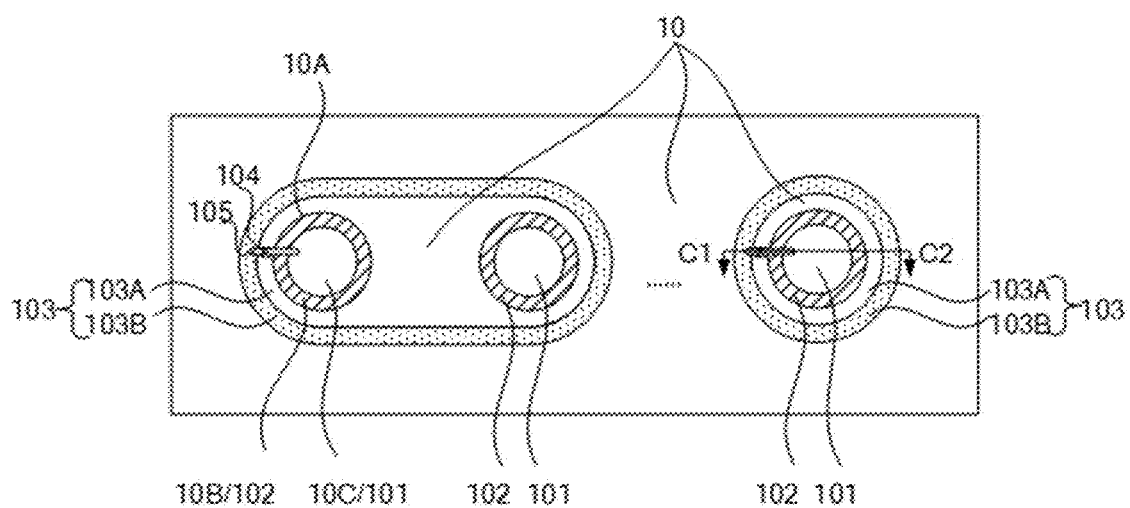
FIG. 4a is a schematic diagram of a structure of another interposer provided by an embodiment of the present disclosure.
Figure 4B:
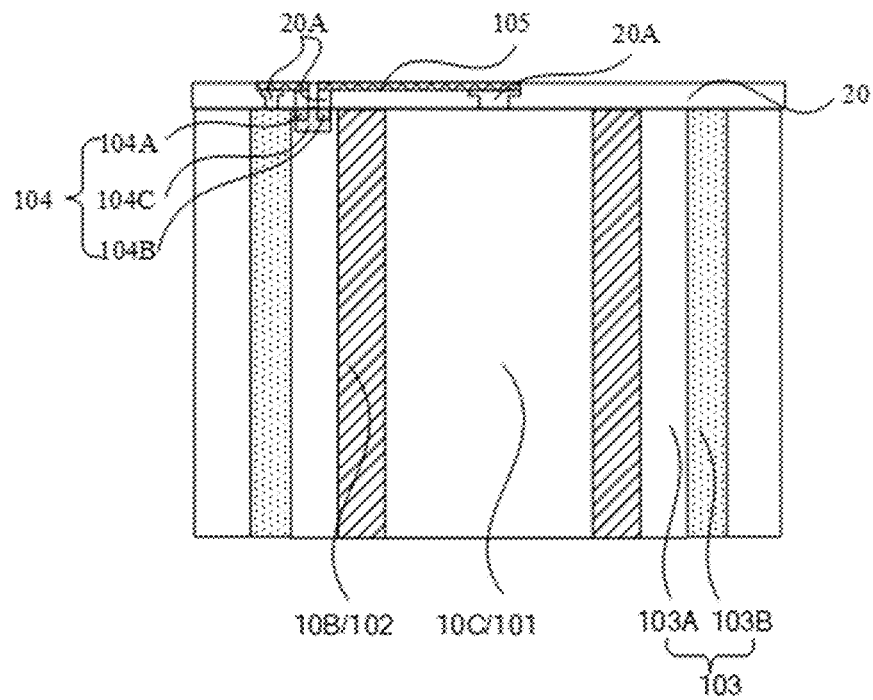
Figure 4C:
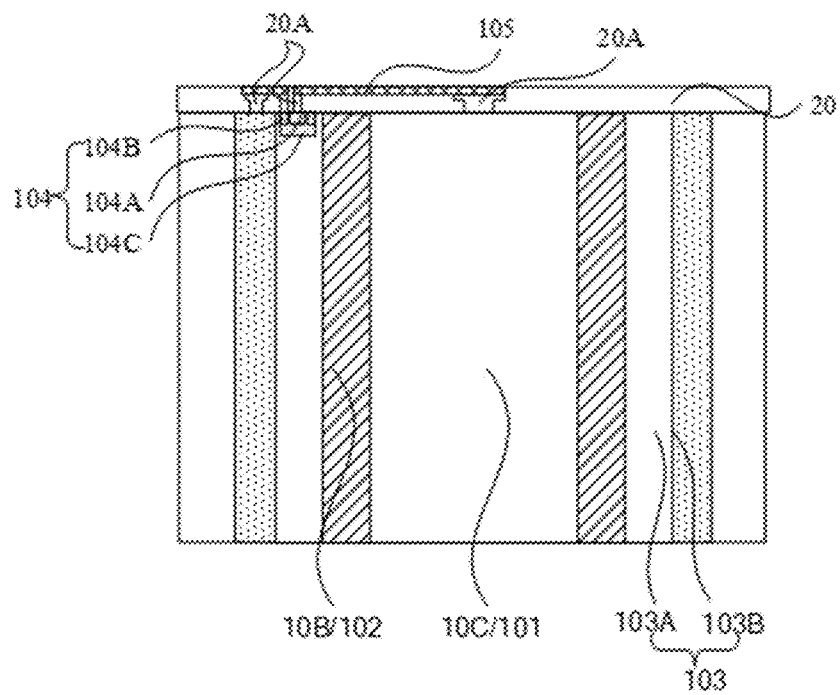

FIG. 4 is a schematic diagram of a structure of another interposer provided by an embodiment of the present disclosure. In an embodiment, FIG. 4b is a sectional view taken along the line "C1-C2" of FIG. 4a. FIG. 4c is another sectional view taken along the line "C1-C2" of FIG. 4a. Referring to FIG. 4, the interposer further includes at least one anti-static device 104 located on a surface of the semiconductor ring 103A of the first conductivity type, wherein the anti-static device 104 includes a first connection end 104A and a second connection end 104B, the first connection end 104A being connected to the signal transmission via 101 through a conductive interconnection line 105 and the second connection end 104B being connected to the semiconductor ring 103B of the second conductivity type through the conductive interconnection line 105.

It should be noted that, referring to FIG. 4, the conductive interconnection line 105 is coupled to the anti-static device 104 and the semiconductor ring 103A of the first conductivity type through a conductive through hole 20A penetrating a passivation layer 20.

Specifically, when there exist electrostatic charges in the signal channel of the signal transmission via 101, the electrostatic charges are coupled and delivered to the semiconductor ring 103B of the second conductivity type through the anti-static device 104, and since the semiconductor ring 103B of the second conductivity type is connected to the bias potential, when the amount of the electrostatic charges existing in the signal channel of the signal transmission via 101 is large enough to break down the anti-static device 104, the anti-static device 104 and the semiconductor ring 103B of the second conductivity type that is connected to the bias potential form a vertical electrostatic charge discharge channel, and the electrostatic charges are coupled to the bias potential through the anti-static device 104, so that the electrostatic charges can be prevented from being delivered to the chip or substrate through the signal transmission via 101 and affecting the performance of the chip and the chip package structure.

In an embodiment, referring to FIG. 4b, the anti-static device 104 includes a reverse-biased diode, wherein a first electrode of the reverse-biased diode is connected as the first connection end 104A to the signal transmission via 101 through the conductive interconnection line 105, and a second electrode of the reverse-biased diode is connected as the second connection end 104B to the semiconductor ring 103B of the second conductivity type through the conductive interconnection line 105.

Specifically, referring to FIG. 4b, an explanation will be given with an example where the first conductivity type is the N type and the second conductivity type is the P type, and the semiconductor ring of the second conductivity type is grounded. The reverse-biased diode includes an N-type doped region 104C, wherein by means of ion implantation, an N+ region is formed in the N-type doped region to serve as the first electrode and the first connection end 104A, and a P+ region is formed to serve as the second electrode and the second connection end 104B, so as to ensure that the anti-static device 104 is a reverse-biased diode, so that when a small amount of electrostatic charges exist in the signal channel of the signal transmission via 101, the reverse-biased diode is in the reverse-biased state, and when an excessive amount of electrostatic charges exist in the signal channel of the signal transmission via 101, the reverse-biased diode will break down, in which case, the reverse-biased diode and the semiconductor ring 103B of the second conductivity type that is connected to the bias potential form a vertical electrostatic charge discharge channel, and the electrostatic charges are coupled and delivered to the semiconductor ring 103B of the second conductivity type through the reverse-biased diode, and since the semiconductor ring 103B of the second conductivity type is grounded, the electrostatic charges can be prevented from being delivered to the chip or substrate through the signal transmission via 101 and affecting the performance of the chip and the chip package structure. It should be noted that the N-type doped region 104C has a higher concentration of carriers than the semiconductor ring 103A of the first conductivity type.

In an embodiment, referring to FIG. 4c, the anti-static device 104 includes a metal-oxide semiconductor field effect transistor (MOSFET), wherein the gate of the MOSFET is connected as the first connection end 104A to the signal transmission via 101 through the conductive interconnection line 105, and the source or drain of the MOSFET is connected as the second connection end 104B to the semiconductor ring 103B of the second conductivity type through the conductive interconnection line 105.

Specifically, referring to FIG. 4c, an explanation will be given with an example where the first conductivity type is the N type and the semiconductor ring of the second conductivity type is grounded. The MOSFET includes an N-type doped region 104C, and by means of ion implantation, two P+ regions and an N+ region are formed in the N-type doped region, wherein the N+ region serves as the gate of the MOSFET, i.e., the first connection end 104A; and the P+ regions serve as the source or drain of the MOSFET, i.e., the second connection end 104B. When a small amount of electrostatic charges exist in the signal channel of the signal transmission via 101, the MOSFET is in a cut-off state, and when an excessive amount of electrostatic charges exist in the signal channel of the signal transmission via 101, the MOSFET is in an on state, in which case, the MOSFET and the semiconductor ring 103B of the second conductivity type that is connected to the bias potential form a vertical electrostatic charge discharge channel, and the electrostatic charges are coupled and delivered to the semiconductor ring 103B of the second conductivity type through the MOSFET, and since the semiconductor ring 103B of the second conductivity type is grounded, the electrostatic charges can be prevented from being delivered to the chip or substrate through the signal transmission via 101 and affecting the performance of the chip.

In an embodiment, the material of the insulator isolation ring 102 includes silicon dioxide and/or aluminum oxide.

Specifically, silicon dioxide and/or aluminum oxide, which are highly insulating materials, can function to isolate and shield the signal transmission via 101.

Figure 5:
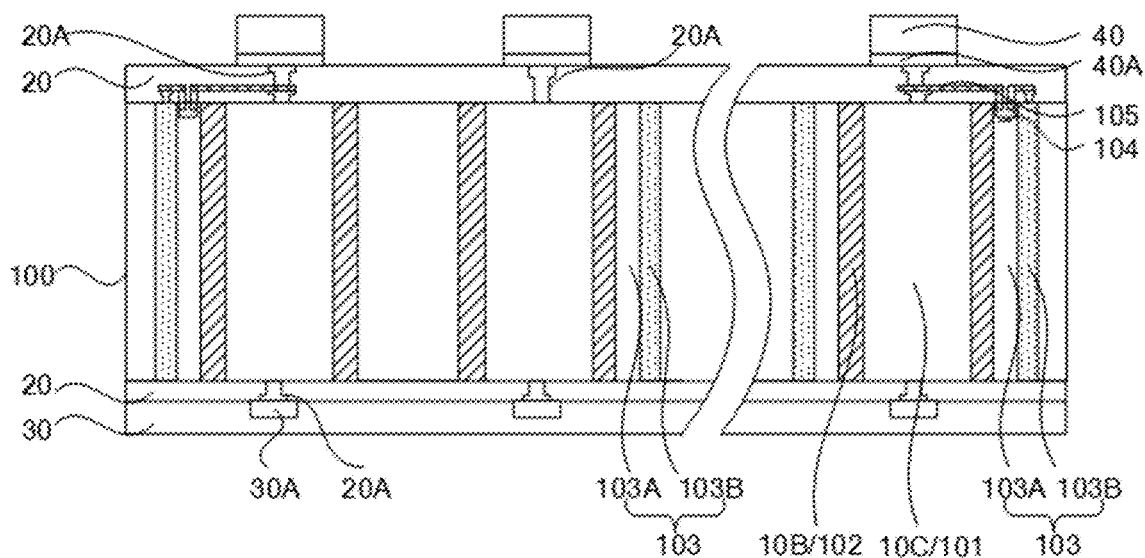
FIG. 5 is a schematic diagram of a chip package structure provided by an embodiment of the present disclosure.

A further embodiment of the present disclosure provides a chip package structure. FIG. is a schematic diagram of a chip package structure provided by an embodiment of the present disclosure. Referring to FIG. 5, the chip package structure includes: a substrate 30, wherein the substrate 30 is provided with at least one pad 30A; an interposer 100 located on a surface of the substrate 30, wherein the interposer 100 is the interposer as described in any one of the above technical schemes, and one signal transmission via 101 is coupled to one pad 30A; and a chip 40, wherein the chip 40 is located on one side of the interposer 100 away from the substrate 30, and the chip 40 is provided with a connection pad 40A, the connection pad 40A being coupled to the signal transmission via 101.

It should be noted that the pad 30A on the substrate 30 is coupled to the signal transmission via 101 through the conductive through hole 20A penetrating the passivation layer 20. The connection pad 40A of the chip 40 is coupled to the signal transmission via 101 through the conductive through hole 20A penetrating the passivation layer 20. By providing a conductive interconnection line on the substrate 30, electrical connection can be realized between different signal transmission vias 101 and the same conductive interconnection line, so as to realize mutual coupling of signal channels of different signal transmission vias 101.

In the technical schemes of the present embodiment, the signal transmission vias 101 on the interposer 100 are provided to realize signal transmission between the chip 40 and the chip 40 and between the chip 40 and the substrate 30. Under the coupling effect of the semiconductor ring 103A of the first conductivity type and the signal channel in the signal transmission via 101, the potential of the semiconductor ring 103A of the first conductivity type is the signal coupling potential, and the semiconductor ring 103B of the second conductivity type is connected with to bias potential. There is a space charge region at the interface between the semiconductor ring 103A of the first conductivity type and the semiconductor ring 103B of the second conductivity type, and since the semiconductor ring 103A of the first conductivity type and the semiconductor ring 103B of the second conductivity type form a reverse-biased PN junction isolation ring 103, a depletion layer exists in the space charge region, and the depletion layer in the space charge region can function to isolate and shield the signal transmission via 101, so as to reduce coupling and crosstalk between signal channels in different signal transmission vias 101 in the interposer.

In addition, the stronger the strength of the signal in the signal channel in the signal transmission via 101, the greater the magnitude of the signal coupling potential of the semiconductor ring 103A of the first conductivity type. The thicker the depletion layer in the space charge region, the stronger the isolation and shielding effect of the reverse-biased PN junction isolation ring 103 on the signal transmission via 101.

It can be understood by those having ordinary skills in the art that all or some of the steps of the methods, systems and functional modules/units in the devices disclosed above can be implemented as software, firmware, hardware and appropriate combinations thereof.

In a hardware embodiment, the division between functional modules/units mentioned in the above description does not necessarily correspond to the division of physical components; in an embodiment, a physical component may have multiple functions, or a function or step may be performed cooperatively by several physical components. Some or all of the physical components may be implemented as software executed by a processor, such as a central processing unit, a digital signal processor or a microprocessor, or as hardware, or as an integrated circuit, such as an application-specific integrated circuit. Such software may be distributed on a computer-readable medium, which may include a computer storage medium (or a non-transitory medium) and a communication medium (or a transitory medium). As well known to those of ordinary skill in the art, the term computer storage medium includes a volatile and nonvolatile, removable and non-removable medium implemented in any method or technique for storing information, such as computer-readable instructions, data structures, program modules or other data. A computer storage medium includes but is not limited to RAM, ROM, EEPROM, flash memory or other memory technologies, CD-ROM, digital versatile disk (DVD) or other optical disk storage, cassettes, magnetic tapes, magnetic disk storage or other magnetic storage devices, or any other medium that can be configured to store desired information and can be accessed by a computer. Furthermore, it is well known to those of ordinary skill in the art that communication media typically contain computer-readable instructions, data structures, program modules or other data in a modulated data signal such as a carrier wave or other transmission mechanism, and can include any information transmission media.

Some embodiments of the present disclosure have been described above with reference to the accompanying drawings and are not to limit the scope of the present disclosure. Any modifications, equivalent substitutions, and improvements made by those skilled in the art without departing from the scope and essence of the present disclosure shall fall within the scope of the present disclosure.

What is claimed is:

1. An interposer, comprising:
at least one signal transmission vias;
at least one insulator isolation rings, one of said insulator isolation rings encircling one of said signal transmission vias; and
at least one reverse-biased PN junction isolation rings, one of said reverse-biased PN junction isolation rings surrounding at least one of said insulator isolation rings, and the reverse-biased PN junction isolation ring comprising a semiconductor ring of a first conductivity type and a semiconductor ring of a second conductivity type from inside to outside, wherein the semiconductor ring of the second conductivity type is connected to a bias potential;
further comprising at least one anti-static device located on a surface of the semiconductor ring of the first conductivity type, wherein the anti-static device comprises a first connection end and a second connection end, the first connection end being connected to the signal transmission via through a conductive interconnection line, and the second connection end being connected to the semiconductor ring of the second conductivity type through a conductive interconnection line, when amount of electrostatic charges existing in a signal channel of the signal transmission via is large enough to break down the anti-static device, the anti-static device and the semiconductor ring of the second conductivity type that is connected to the bias potential form a vertical electrostatic charge discharge channel, and the electrostatic charges are coupled to the bias potential through the anti-static device.

2. The interposer of claim 1, wherein signal channels of the signal transmission vias that are distributed in a space surrounded by the reverse-biased PN junction isolation ring are coupled to each other.

3. The interposer of claim 1, wherein the signal transmission vias are uniformly distributed in a space surrounded by the reverse-biased PN junction isolation ring.

4. The interposer of claim 1, wherein one of said reverse-biased PN junction isolation rings surrounds one of said insulator isolation rings, and the signal transmission via and the reverse-biased PN junction isolation ring are coaxially provided.

5. The interposer of claim 1, wherein the first conductivity type comprises an N type and the second conductivity type comprises a P type, and the semiconductor ring of the second conductivity type is grounded.

6. The interposer of claim 1, further comprising: a semiconductor substrate of the first conductivity type, wherein the semiconductor substrate of the first conductivity type is provided with at least one through hole and at least one of said semiconductor rings of the second conductivity type, wherein an insulator material and a conductive post are provided in the through hole in sequence from outside to inside, the insulator material constituting the insulator isolation ring and the conductive post constituting the signal transmission via; and one of said semiconductor rings of the second conductivity type surrounds at least one of said through holes and is spaced from the through hole by a preset distance, and the semiconductor substrate of the first conductivity type between the through hole and the semiconductor ring of the second conductivity type constitutes the semiconductor ring of the first conductivity type.

7. The interposer of claim 1, wherein the anti-static device comprises a reverse-biased diode, wherein a first electrode of the reverse-biased diode is connected as the first connection end to the signal transmission via through the conductive interconnection line, and a second electrode of the reverse-biased diode is connected as the second connection end to the semiconductor ring of the second conductivity type through the conductive interconnection line.

8. The interposer of claim 1, wherein the anti-static device comprises a metal-oxide semiconductor field effect transistor (MOSFET), wherein a gate of the MOSFET is connected as the first connection end to the signal transmission via through the conductive interconnection line, and a source or drain of the MOSFET is connected as the second connection end to the semiconductor ring of the second conductivity type through the conductive interconnection line.

9. The interposer of claim 1, wherein material of the insulator isolation ring is selected from a group consisting of silicon dioxide, aluminum oxide, and combination thereof.

10. A chip package structure, comprising:

a substrate, wherein the substrate is provided with at least one pad;

an interposer located on a surface of the substrate, wherein one signal transmission via is coupled to one of said pads; and a chip, wherein the chip is located on one side of the interposer away from the substrate, and the chip is provided with a connection pad, the connection pad being coupled to the signal transmission via;

wherein the interposer comprises:

at least one signal transmission vias;

at least one insulator isolation rings, one of said insulator isolation rings encircling one of said signal transmission vias; and at least one reverse-biased PN junction isolation rings, one of said reverse-biased PN junction isolation rings surrounding at least one of said insulator isolation rings, and the reverse-biased PN junction isolation ring comprising a semiconductor ring of a first conductivity type and a semiconductor ring of a second conductivity type from inside to outside, wherein the semiconductor ring of the second conductivity type is connected to a bias potential;

further comprising at least one anti-static device located on a surface of the semiconductor ring of the first conductivity type, wherein the anti-static device comprises a first connection end and a second connection end, the first connection end being connected to the signal transmission via through a conductive interconnection line, and the second connection end being connected to the semiconductor ring of the second conductivity type through a conductive interconnection line, when amount of electrostatic charges existing in a signal channel of the signal transmission via is large enough to break down the anti-static device, the anti-static device and the semiconductor ring of the second conductivity type that is connected to the bias potential form a vertical electrostatic charge discharge channel, and the electrostatic charges are coupled to the bias potential through the anti-static device.

* * * * *